United States Patent
Izumiguchi

(10) Patent No.: US 6,844,753 B2
(45) Date of Patent: Jan. 18, 2005

(54) OUTPUT CIRCUIT OF SEMICONDUCTOR INTEGRATED CIRCUIT DEVICE

(75) Inventor: Dai Izumiguchi, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 25 days.

(21) Appl. No.: 10/465,871

(22) Filed: Jun. 20, 2003

(65) Prior Publication Data

US 2004/0140827 A1 Jul. 22, 2004

(30) Foreign Application Priority Data

Jan. 17, 2003 (JP) .................................. 2003-010186

(51) Int. Cl.⁷ .......................... H03K 17/16; H03K 5/12
(52) U.S. Cl. .......................... 326/27; 326/87; 327/170
(58) Field of Search ............................. 326/27, 57, 58, 326/83, 87; 327/108, 112, 170

(56) References Cited

U.S. PATENT DOCUMENTS 5,120,992 A 6/1992 Miller et al.
6,236,248 B1 * 5/2001 Koga .......................... 327/112
6,441,653 B1 * 8/2002 Spurlin ........................ 327/108
6,559,676 B1 * 5/2003 Tomita ......................... 326/81

FOREIGN PATENT DOCUMENTS

| JP | 04337923 A | 11/1992 |
| JP | 05218847 A | 8/1993 |
| JP | 09148909 | 6/1997 |
| JP | 10290154 A | 10/1998 |

* cited by examiner

*Primary Examiner*—Daniel D. Chang
(74) *Attorney, Agent, or Firm*—Volentine Francos & Whitt, P.L.L.C.

(57) ABSTRACT

This invention provide a new and improved output circuit of a semiconductor integrated circuit device that enables output of a slew-rate waveform with a desired gradient without generating unwanted delay and also enables reduction in switching noise. According to this invention, an output circuit of a semiconductor integrated circuit device for controlling the gradient of an output waveform of a CMOS output transistor using first and second variable resistance units (transfer gates) controlled by a signal of an input part has another CMOS output circuit for delaying rise of a gate by dividing an output part and connecting first and second resistance units (NMOS transistor and PMOS transistor) to the gates.

13 Claims, 6 Drawing Sheets

C21 { P21, N21 }  C23 { P23, N23 }

C22 { P22, N22 }  C24 { P24, N24 }

C1 { P1, N1 }  C2 { P2, N2 }

C8 { P8, N8 }  C3 { P3, N3 }

C9 { P9, N9 }

OUTPUT CIRCUIT OF SEMICONDUCTOR INTEGRATED CIRCUIT DEVICE

BACKGROUND OF THE INVENTION

1. Field of the Invention

This invention relates to an output buffer circuit of a semiconductor integrated circuit device, and particularly to an output circuit that makes the gradient of a rise/fall waveform of an output gentler.

2. Description of the Related Art

In a semiconductor integrated circuit device, if a rise/fall output waveform at the time of switching is steep, noise easily occurs in the power-supply potential and GND. Therefore, as a method for reducing the switching noise, it is conventionally effective to increase the rise/fall time (to make the gradient gentler).

As a conventional circuit for making the rise/fall gradient of an output waveform gentler, a slew-rate output circuit of a CMOS transistor as shown in FIG. 1 is used. The main features of its circuit structure will now be described. An input A is connected to the gates of a PMOS transistor P22, an NMOS transistor N22, a PMOS transistor P23 and an NMOS transistor N23 constituting initial-stage inverters C22 and C23. Transfer gates T22 and T23 are connected to the initial-stage inverters C22 and C23, respectively. The drain of the PMOS transistor P22 is connected to the gate of a PMOS transistor P24 constituting a next-stage inverter C24. The drain of the NMOS transistor N23 is connected to the gate of an NMOS transistor N24 of the next-stage inverter.

An output of the next-stage inverter NC24 is connected to the gates of the transfer gates T22 and T23. The drains of the transfer gates T22 and T23 are connected to the gates of a PMOS transistor P21 and an NMOS transistor N21 constituting an output transistor, respectively. An output Y is taken out from the drain of a CMOS output transistor C21 connected to a first power-supply potential Vc and a second power-supply potential Vs (GND).

In the operation of this circuit, first, when the input A is switched from 0 (L) to a power-supply voltage (H), the NMOS transistor N22 is turned into ON-state. Influenced by ON-state resistance of the transfer gate T22, the gate potentials of the PMOS transistors P21 and P24 are gradually switched to L, and after a while, the PMOS transistors P21 and P24 are turned into ON-state. When also the NMOS transistor of the transfer gate T22 is turned into ON-state, the fall in gate potential of the PMOS transistors P21 and P24 becomes much gentler. As a result, the output Y has a gentle rise waveform.

When the input A is switched from the power-supply voltage (H) to 0 (L), the PMOS transistor P23 is turned into ON-state. Influenced by ON-state resistance of the transfer gate T23, the gate potentials of the NMOS transistors N21 and N24 are gradually switched to H, and after a while, the NMOS transistors N21 and N24 are turned into ON-state. Since also the PMOS transistor of the transfer gate T23 is turned into ON-state, the rise in gate potential of the NMOS transistors N21 and N24 becomes much gentler. As a result, the output Y has a gentle fall waveform.

Other than the above-described technique, JP-A-5-218847, JP-A-9-148909, JP-A-10-290154, and Japanese Patent No.3,014,164 disclose output circuits for controlling the slew rate in order to prevent the switching noise.

However, in the above-described circuit for controlling the rise/fall time of an output waveform (to make the waveform gradient gentler) using the transfer gates, in order to increase ON-state resistance and make the rise/fall in gate potential of the output transistor gentler, a large number of constituent transistors must be used in the transfer gates for controlling the output transistor. Moreover, even a dimensional change of the transistors is not enough for making the waveform gradient gentler, and a problem arises that only the delay of an output signal increases while the waveform does not become gentler.

SUMMARY OF THE INVENTION

Thus, it is an object of the present invention to provide a new and improved output circuit of a semiconductor integrated circuit device that enables output of a slew-rate waveform with a desired gradient without generating unwanted delay and also enables reduction in switching noise. According to the present invention, an output circuit of a semiconductor integrated circuit device for controlling the gradient of an output waveform of a CMOS output transistor using first and second variable resistance units (transfer gates) controlled by a signal of an input part has another CMOS output circuit for delaying rise of a gate by dividing an output part and connecting first and second resistance units (NMOS transistor and PMOS transistor) to the gates. In the output circuit thus constituted, an output of an output transistor in a circuit according to the conventional technique for controlling the rise/fall time of an output waveform (to mage the waveform gradient gentler) using a transfer gate is divided, and an output transistor having a much gentler rise/fall waveform gradient is connected using the first and second resistance units (ON-state resistance of the transistor) connected to the gate, thereby enabling provision of an output waveform with a gentle gradient without significantly delaying an output signal. Thus, it is possible to restrain switching noise. By changing the rate of division, it is possible to provide a waveform with a desired output gradient.

BRIEF DESCRIPTION OF THE DRAWINGS

FIG. 6A shows rise waveforms. FIG. 6B shows fall waveforms.

DETAILED DESCRIPTION OF THE PREFERRED EMBODIMENTS

Preferred embodiments of the output circuit of the semiconductor integrated circuit device according to the present invention will now be described in detail with reference to the attached drawings. In this specification and drawings, constituent elements having substantially the same functional structures are denoted by the same symbols and numerals and will not be described repeatedly.

First Preferred Embodiment

Figure 1:
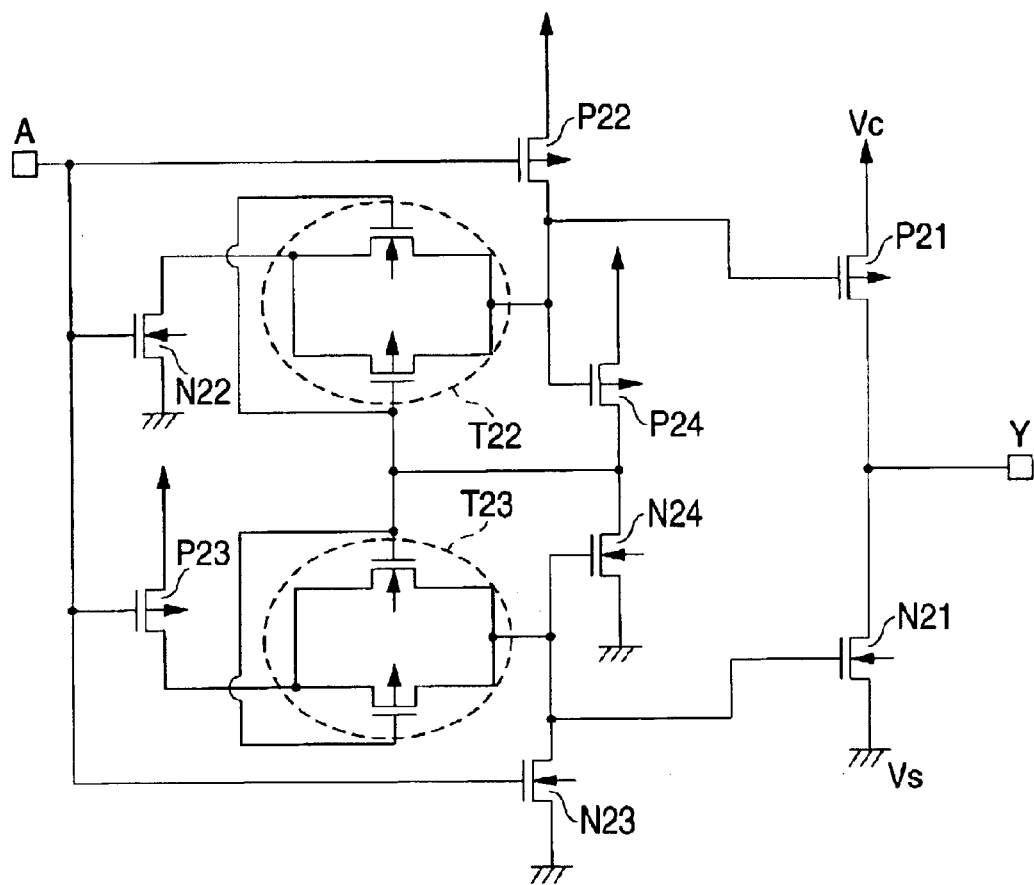
FIG. 1 is a diagram showing a conventional output circuit.
Figure 2:
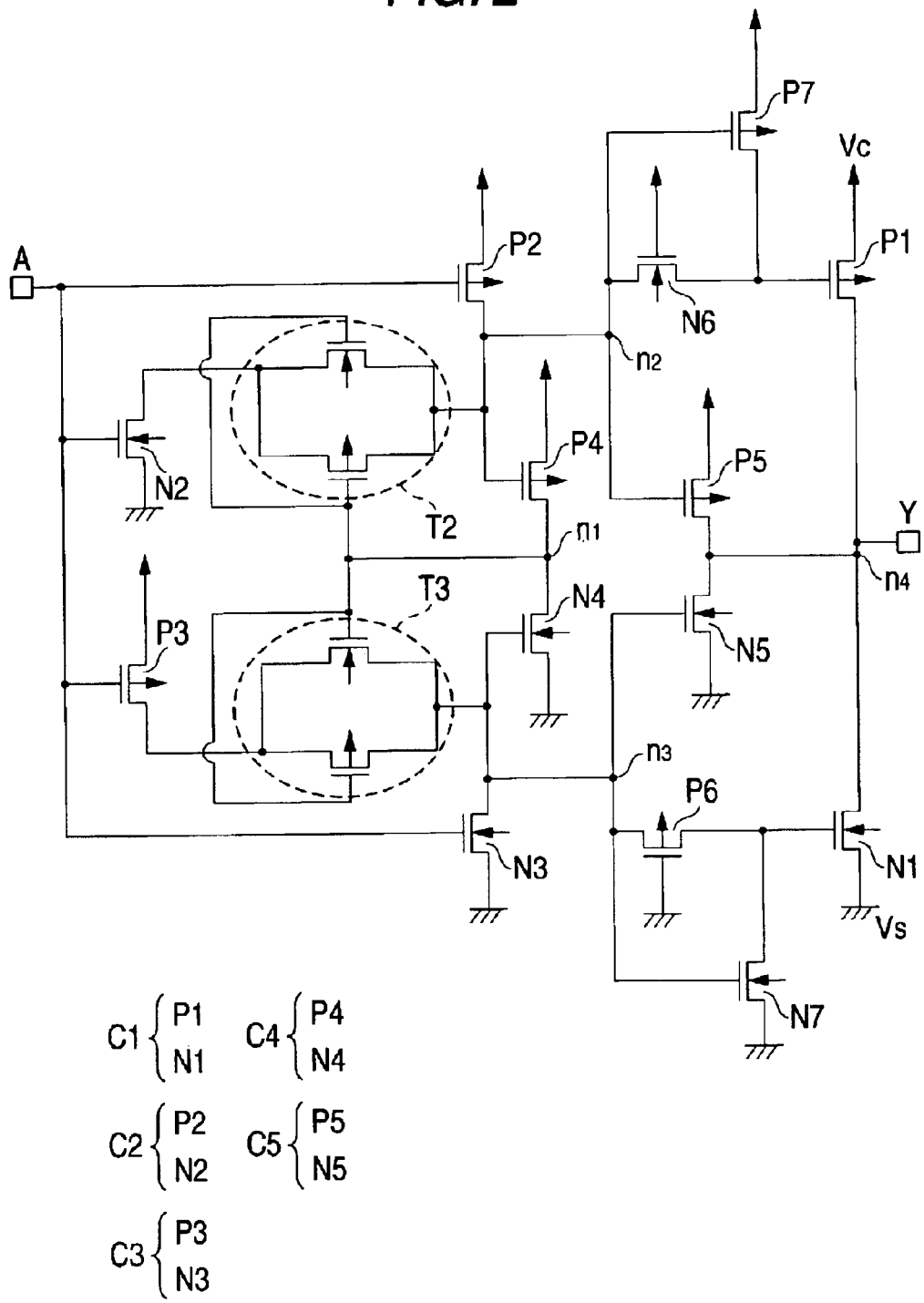
FIG. 2 is a diagram showing an output circuit according to a first preferred embodiment.

A first preferred embodiment will be described with reference to FIG. 2. On the input side, an input A is connected to the gates of a PMOS transistor P2 and an NMOS transistor N2 forming a CMOS inverter C2, which is a first CMOS inverter circuit, and the gates of a PMOS transistor P3 and an NMOS transistor N3 forming a CMOS inverter C3, which is a second CMOS inverter circuit, the CMOS inverters C2 and C3 being connected in series between a first power-supply potential (for example, power Vc) and a second power-supply potential (for example, ground GND).

Between the drains of the CMOS inverters C2 and C3, transfer gates T2 and T3 are connected, which are first and second variable resistance units each being constituted by an NMOS transistor and a PMOS transistor. The drain (node n2) of the CMOS inverter C2 and the drain (node n3) of the CMOS inverter C3 are connected to the gates of a PMOS transistor P4 and an NMOS transistor N4 forming a first CMOS circuit C4 and the gates of a PMOS transistor P5 and an NMOS transistor N5 forming a second CMOS circuit C5, the PMOS transistor P4 and the NMOS transistor N4, and the PMOS transistor P5 and the NMOS transistor N5 being connected in series between the first power-supply potential and the second power-supply potential.

Moreover, an output part (node n1) of the CMOS circuit C4 with its gates connected with the node n2 and the node n3 is connected to the gates of the transfer gates T2 and T3. An output of the CMOS circuit C5 and an output Y are divided via a node n4, and to these outputs, a PMOS transistor P1 and an NMOS transistor N1 forming a third CMOS circuit C1 and connected in series between the first power-supply potential and the second power-supply potential are connected.

To the gates of the CMOS circuit C1, an NMOS transistor N6 and a PMOS transistor P6 of normally-on state are connected, which are connected as first and second resistance units and have their gates connected to the first power-supply potential and the second power-supply potential, respectively. Between the sources and drains of the NMOS transistor N6 and the PMOS transistor P6, a PMOS transistor P7 and an NMOS transistor N7 are connected by their gates and drains, respectively. The source of the PMOS transistor P7 is connected to the first power-supply potential. The source of the NMOS transistor N7 is connected to the second power-supply potential.

The operation of these circuits will be described now. When the input A is switched from 0 (L) to a power-supply voltage (H), the NMOS transistor N2 is turned into ON-state. Influenced by ON-state resistance of the transfer gate T2, the gate potentials of the PMOS transistors P5 and P4 are gradually switched to L, and after a while, the PMOS transistors P5 and P4 are turned into ON-state. As a result, the output of the PMOS transistor P5 is gently switched from L to H. As the NMOS transistor of the transfer gate T2 is thus turned into ON-state, the fall in gate potential of the PMOS transistors P5 and P1 becomes gentler. Also the gate potential of the PMOS transistor P1 gradually falls, influenced by ON-state resistance of the NMOS transistor N6. As a result the output waveform of the output Y is gently switched from L to H.

When the input A is switched from the power-supply voltage (H) to 0 (L), the PMOS transistor P3 is turned into ON-state. Influenced by ON-state resistance of the transfer gate T3, the gate potentials of the NMOS transistors N5 and N4 are gradually switched to H. As a result, the output of the NMOS transistor N5 is gently switched from H to L. As the PMOS transistor of the transfer gate T3 is turned into ON-state, the rise in gate potential of the NMOS transistors N5 and N1 becomes gentler. Also the gate potential of the NMOS transistor N1 gradually rises, influenced by ON-state resistance of the PMOS transistor P6. As a result, the output waveform of the output Y is gently switched from H to L.

To increase the ON-state resistance of the transfer gates and the ON-state resistance of the NMOS transistor and PMOS transistor, plural NMOS transistors and PMOS transistors may be connected in parallel to the gates, and a gentler output waveform can be thus realized.

In this preferred embodiment, the effect of dividing the output transistor is that only the waveform gradient of the transistor can be made gentler in order to cause desired rise/fall in output at one output transistor and restrain acute rise/fall in output at the other output transistor having delayed rise/fall, thus preventing occurrence of unwanted delay. The waveform can also be controlled to a desired waveform in accordance with the rate of division, that is, different combinations of output transistors.

Figure 6A:
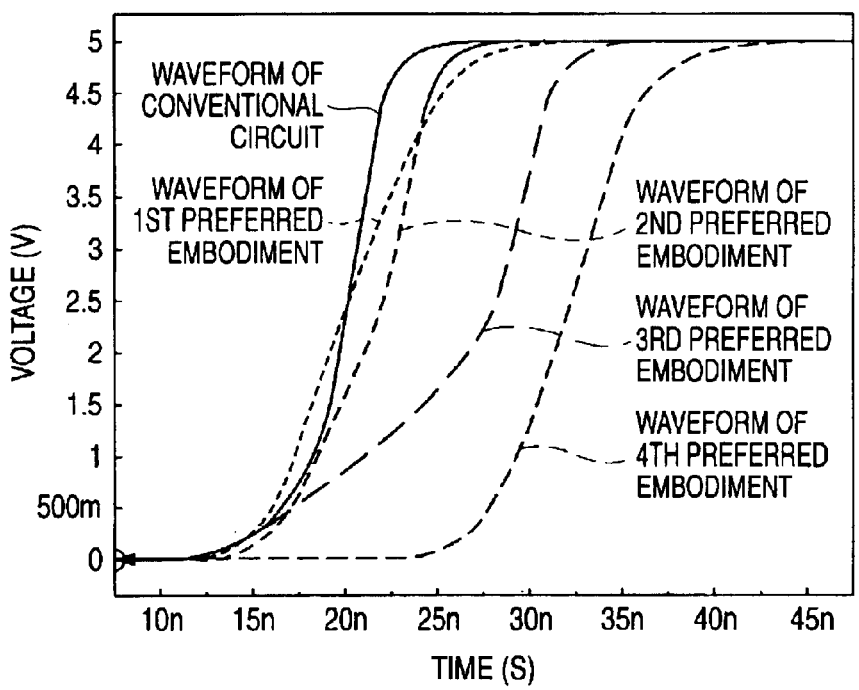
FIGS. 6A and 6B are views showing the relation between output voltage and time in the output circuits of the first to fourth embodiments and the conventional output circuit.
Figure 6B:
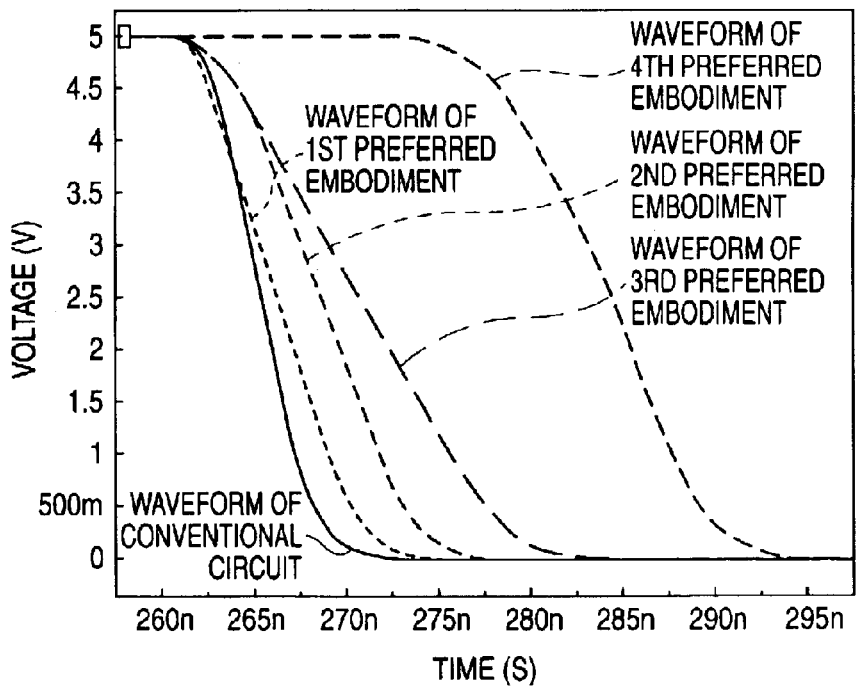

FIGS. 6A and 6B show rise/fall output waveforms according to this preferred embodiment. It can be seen that a gentler gradient than in the conventional technique can be realized without generating delay.

As described above, as the drains of the transistor having large ON-state resistance are connected to the gates of the divided output transistors, the output waveform can be made gentler. Moreover, a desired output waveform can be realized in accordance with the rate of division of the output transistors (output ratio of the output transistors).

Second Preferred Embodiment

Figure 3:
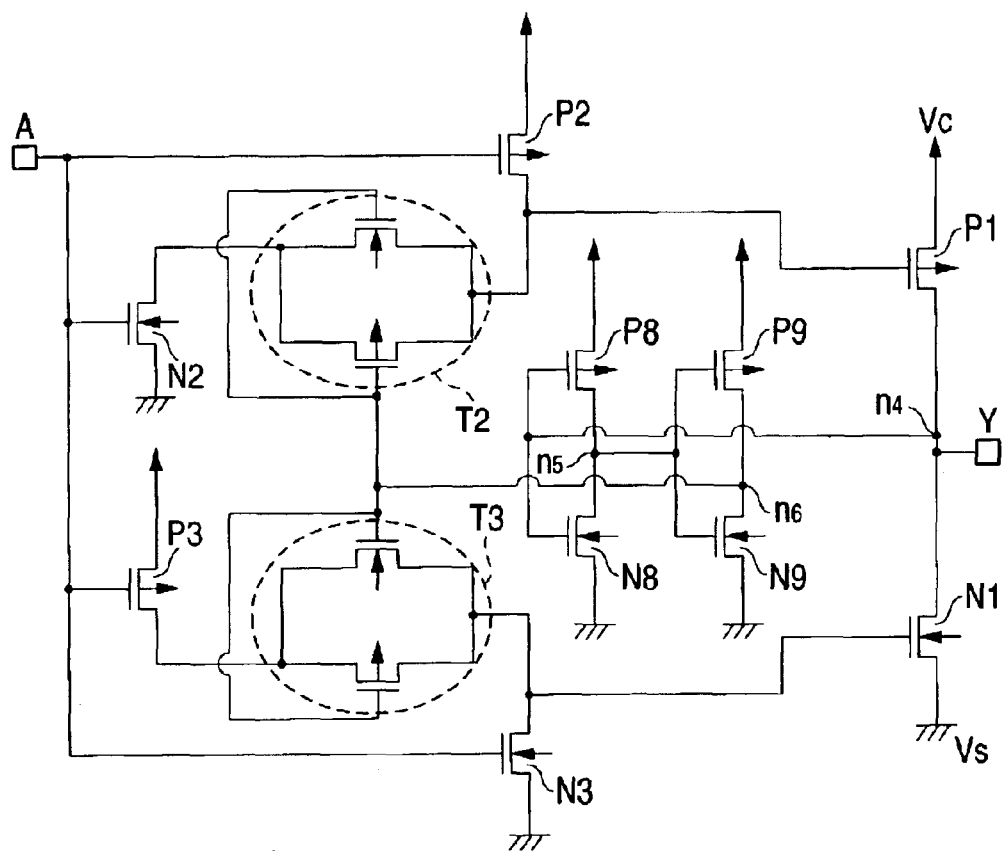
FIG. 3 is a diagram showing an output circuit according to a second preferred embodiment.

A second preferred embodiment will be described with reference to FIG. 3. The structures up to first and second CMOS inverter circuits are the same as those of the first preferred embodiment shown in FIG. 2. The structure of an output part includes a CMOS circuit C1 including a PMOS transistor P1 and an NMOS transistor N1, a CMOS inverter C8, which is a third CMOS inverter circuit, and a CMOS inverter C9, which is a fourth CMOS inverter circuit. An output (node n4) of the CMOS circuit C1 is connected to the gates of the CMOS inverter C8. An output (node n5) of the CMOS inverter C8 is connected to the gates of the CMOS inverter C9. An output (node n6) of the CMOS inverter C9 is connected to the gates of the transfer gates T2 and T3. The CMOS inverters and the CMOS output transistors are connected in series between the first power-supply potential and the second power-supply potential.

Similarly to the first preferred embodiment, when the input A is switched from 0 (L) to a power-supply voltage (H), the output of the transfer gate T2 is gradually switched from H to L. As a result, the gate potential of the PMOS transistor P1 is gradually switched from L to H and the output Y rises gently. The output Y is fed back by two-stage inverters constituted by the CMOS inverter C8 and the CMOS inverter C9 and the gate potential of the transfer gate T2 is gradually switched from L to H. With the synergistic effect of these, the gate potential of the PMOS transistor P1 is switched from H to L more gently and the output Y rises more gently.

When the input A is switched from the power-supply voltage (H) to 0 (L), the output of the transfer gate T3 is switched from L to H more gently. As a result, the gate potential of the NMOS transistor N1 is gradually switched from H to L and the output Y falls gently. The output Y is fed back by the two-stage inverters constituted by the CMOS inverter C8 and the CMOS inverter C9 and the gate potential of the transfer gate T3 is gradually switched from H to L. With the synergistic effect of these, the gate potential of the NMOS transistor N1 is switched from L to H more gently and the output Y falls more gently.

FIGS. 6A and 6B show rise/fall output wave forms according to this preferred embodiment. It can be seen that a gentler gradient than in the conventional technique and the first preferred embodiment can be realized. The reason for the steep gradient from near 20 nS in the rise waveform is that the transfer gate is initially in OFF-state for a while because of the influence of delay at the two-stage inverters and has a relatively steep gradient from 20 nS after it is turned into ON-state. A similar action is taken in the fall waveform, too. However, since the output NMOS transistor has high performance, the change in gradient does not appear.

As described above, according to the second preferred embodiment, since the feedback output of the CMOS output transistor can be delayed by the two-stage inverters, the switching of the transfer gate can be delayed. Therefore, the input signal of the gate of the output transistor gently rises and falls, and the output waveform can be thus made gentler.

Third Preferred Embodiment

Figure 4:
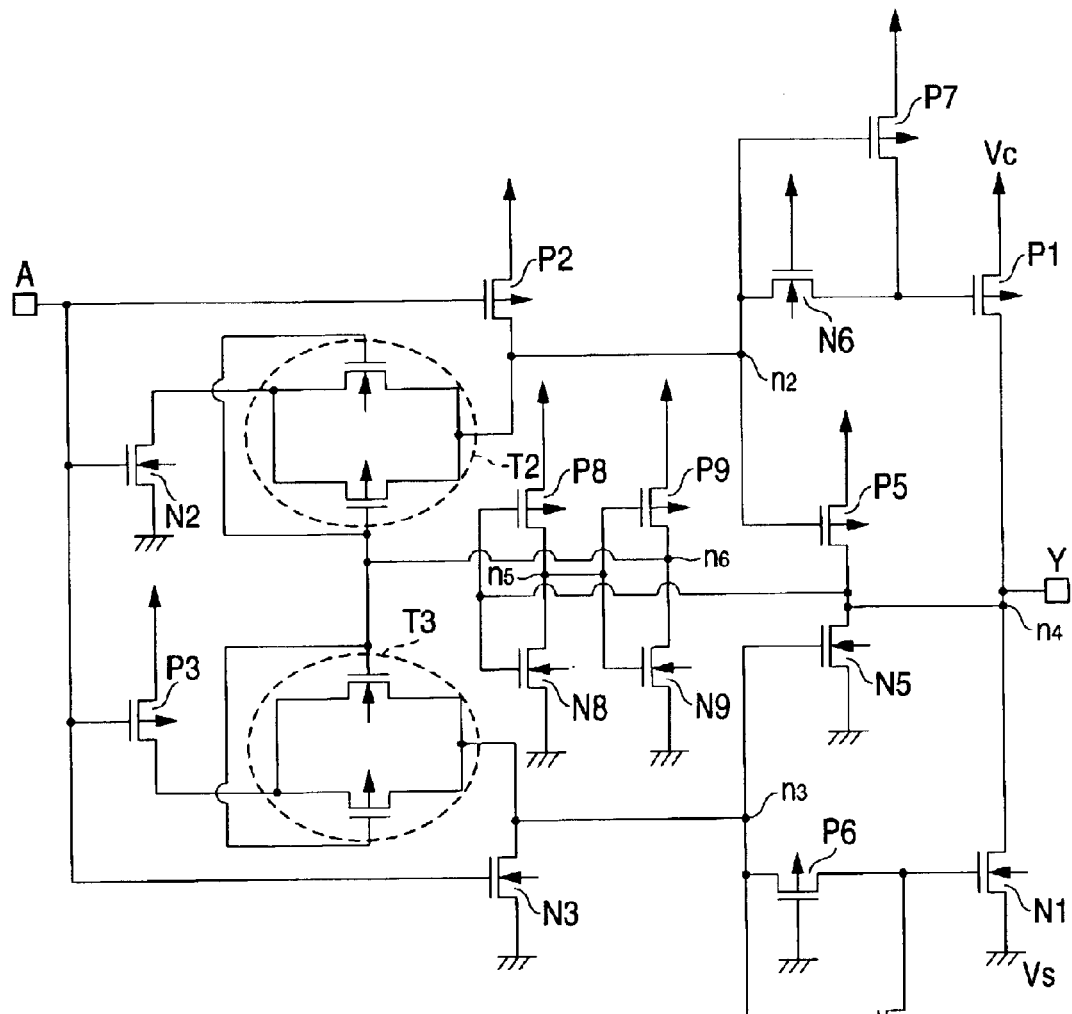
FIG. 4 is a diagram showing an output circuit according to a third preferred embodiment.

A third preferred embodiment will be described with reference to FIG. 4. As this preferred embodiment has a structure constituted by adding the structure of the second preferred embodiment to the structure of the first preferred embodiment, it will not be described further in detail.

The output Y is divided into a CMOS circuit C5 including a PMOS transistor P5 and an NMOS transistor N5, which is a first CMOS circuit, and a CMOS circuit C1 including a PMOS transistor P1 and an NMOS transistor N1, which is a second CMOS circuit. Similarly to the first preferred embodiment, PMOS transistors P6 and P7 and NMOS transistors N6 and N7 are connected the gates of the PMOS and NMOS transistors P1 and N1 of the CMOS circuit C1. Similarly to the second preferred embodiment, CMOS inverters C8 and C9 are connected to a node n4 of the CMOS circuit C5.

Similarly to the first preferred embodiment, when the input A is switched from 0 (L) to a power-supply voltage (H), the output of the transfer gate T2 is gradually switched from H to L. Influenced by ON-state resistance of the NMOS transistor N6, the gate potential of the PMOS transistor P1 is gradually switched from H to L and the output Y is gently switched from L to H. The output Y is fed back by two-stage inverters constituted by the CMOS inverters C8 and C9 and the gate potential of the transfer gate T2 is gradually switched from L to H. With the synergistic effect of these, the gate potential of the PMOS transistor P1 is switched from H to L more gently and the output Y rises more gently.

When the input A is switched from the power-supply voltage (H) to 0 (L), the output of the transfer gate T3 is switched from L to H gently. Influenced by ON-state resistance of the PMOS transistor P6, the gate potential of the NMOS transistor N1 is gradually switched from L to H and the output Y is gently switched from H to L. The output Y is fed back by the two-stage inverters constituted by the CMOS inverters C8 and C9 and the gate potential of the transfer gate T3 is gradually switched from H to L. With the synergistic effect of these, the gate potential of the NMOS transistor N1 is switched from H to L more gently and the output Y falls more gently.

As described above, according to the third preferred embodiment, in addition to the effect of the second preferred embodiment, the gate input signal of the CMOS output transistor can gently rise and fall because of the ON-state resistance of the transistors. Therefore, the output waveform of the output transistor can be made gentler, as shown in FIGS. 6A and 6B.

Fourth Preferred Embodiment

Figure 5:
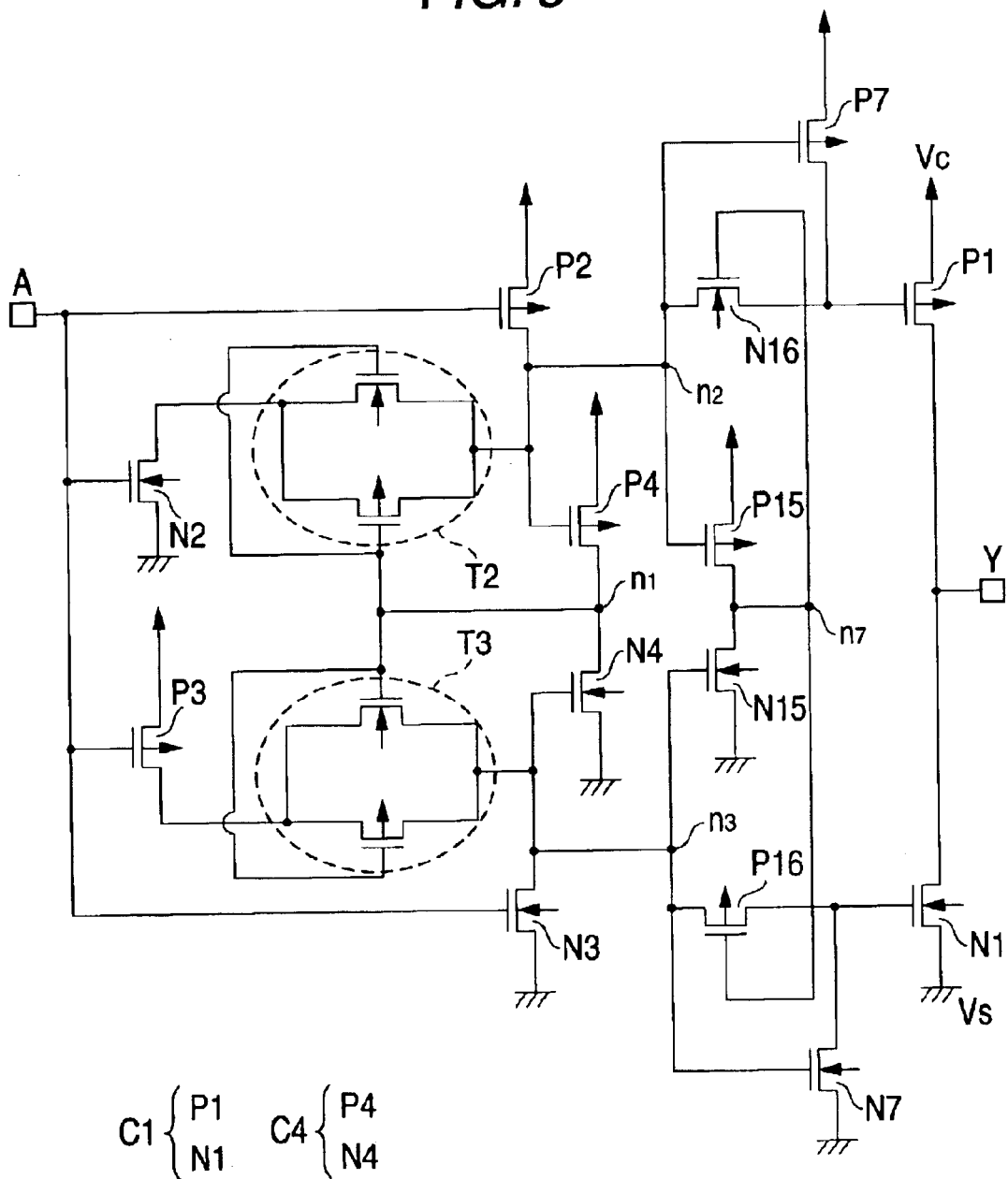
FIG. 5 is a diagram showing an output circuit according to a fourth preferred embodiment.

A fourth preferred embodiment will be described with reference to FIG. 5. This embodiment employs a structure that realizes gentler rise/fall in gate potential of a CMOS output circuit. The drain (node n2) of a CMOS inverter C2, which is a first CMOS inverter circuit, and the drain (node n3) of a CMOS inverter C3, which is a second CMOS inverter circuit, are connected to the gates of a PMOS transistor P4 and an NMOS transistor N4 constituting a CMOS circuit C4 and the gates of a PMOS transistor P15 and an NMOS transistor N15 constituting a CMOS circuit C15. An output (node n7) of the CMOS circuit C15 is connected to the gate of an NMOS transistor N16 with its source connected to the node n2 and is also connected to the gate of a PMOS transistor P16 with its source connected to the node n3.

Between the source and drain of the NMOS transistor N16, a PMOS transistor P7 is connected by its gate and drain. Between the source and drain of the PMOS transistor P16, an NMOS transistor N7 is connected by its gate and drain. The sources of the PMOS transistor P7 and the NMOS transistor N7 are connected to the first power-supply potential and the second power-supply potential, respectively. The drains of the NMOS transistor N16 and the PMOS transistor P16 are connected to the gates of a CMOS circuit C1 including a PMOS transistor P1 and an NMOS transistor N1. An output of the CMOS circuit C1 is taken out from the output part Y. The CMOS inverters and the CMOS output transistors are connected in series between the first power-supply potential and the second power-supply potential.

When the input A is switched from 0 (L) to a power-supply potential (H), the output of the transfer gate T2 is gradually switched from H to L. As the output of the transfer gate T2 is inputted to the gate of the CMOS circuit C15, the output of the inverter is gently switched from L to H. Since the output of the CMOS circuit 15 is connected to the gate of the NMOS transistor N16, the NMOS transistor N16 is turned on with a delay. Because of the ON-state resistance and the switching delay of the NMOS transistor N16, the input signal of the gate of the PMOS transistor P1 is delayed and gently switched from H to L. Therefore, the output of the CMOS circuit C1 is gently switched from L to H.

When the input A is switched from the power-supply potential (H) to 0 (L), the output of the transfer gate T3 is gradually switched from L to H. As the output of the transfer gate T3 is inputted to the gate of the CMOS circuit C15, the output is gently switched from H to L. Since the output of the CMOS circuit 15 is connected to the gate of the PMOS transistor P16, the PMOS transistor P16 is turned on with a delay. Because of the ON-state resistance and the switching delay of the PMOS transistor P16, the input signal of the gate of the NMOS transistor N1 is delayed and gently switched from L to H. Therefore, the output of the CMOS circuit C1 is gently switched from H to L.

Also in this preferred embodiment, to increase the ON-state resistance of the transfer gates and the ON-state resistance of the NMOS transistor and PMOS transistor, plural NMOS transistors and PMOS transistors may be connected in parallel to the gates, and a gentler output waveform can be thus realized.

As described above, according to the fourth preferred embodiment, since the gate input signal of the output transistor gently rises and falls because of the ON-state resistance of the inverters, a very gentle output waveform can be realized, as shown in FIGS. 6A and 6B.

While the preferred embodiments of the output circuit of the semiconductor integrated circuit device according to the present invention are described above with reference to the attached drawings, the present invention is not limited to these embodiments. It is clear to those skilled in the art that various changes and modifications can be implemented without departing from the technical scope of the invention as defined by the appended claims, and that such changes and modifications are included in the technical scope of the invention.

What is claimed is:

1. An output circuit of a semiconductor integrated circuit device comprising:

a first CMOS inverter circuit including a PMOS transistor (P2) and an NMOS transistor (N2) connected in series via a first variable resistance unit having a control electrode between a first power-supply potential and a second power-supply potential;

a second CMOS inverter circuit including a PMOS transistor (P3) and an NMOS transistor (N3) connected in series via a second variable resistance unit having a control electrode between the first power-supply potential and the second power-supply potential;

a first CMOS circuit including a PMOS transistor (P4) and an NMOS transistor (N4) connected in series via a node n1 between the first power-supply potential and the second power supply potential, the node n1 being connected to the control electrodes of the first and second variable resistance units, the PMOS transistor (P4) having a gate connected to a drain (node n2) of the PMOS transistor (P2), the NMOS transistor (N4) having a gate connected to a drain (node n3) of the NMOS transistor (N3);

a second CMOS circuit including a PMOS transistor (P5) and an NMOS transistor (N5) connected in series via a node n4 between the first power-supply potential and the second power-supply potential, the PMOS transistor (P5) having a gate connected to the node n2, the NMOS transistor (N5) having a gate connected to the node n3;

a third CMOS circuit including a PMOS transistor (P1) and an NMOS transistor (N1) connected in series via the node n4 between the first power-supply potential and the second power-supply potential;

a first resistance unit connected between a gate of the PMOS transistor (P1) and the node n2;

a second resistance unit connected between a gate of the NMOS transistor (N1) and the node n3;

a PMOS transistor (P7) having a source connected to the first power-supply potential, a gate connected to the node n2, and a drain connected to the gate of the PMOS transistor (P1); and an NMOS transistor (N7) having a source connected to the second power-supply potential, a gate connected to the node n3, and a drain connected to the gate of the NMOS transistor (N1).

2. The output circuit of the semiconductor integrated circuit device as claimed in claim 1, wherein the first variable resistance unit and the second variable resistance unit are transfer gates formed by commonly connecting, in parallel, gates of plural PMOS transistor circuits and NMOS transistor circuits that are connected in series, and the control electrodes are the gates.

3. The output circuit of the semiconductor integrated circuit device as claimed in claim 1, wherein the first resistance unit is formed by an NMOS transistor having a gate connected to the first power-supply potential, a drain connected to the gate of the PMOS transistor (P1), and a source connected to the node n2, and the second resistance unit is formed by a PMOS transistor having a gate connected to the second power-supply potential, a drain connected to the gate of the NMOS transistor (N1), and a source connected to the node n3.

4. The output circuit of the semiconductor integrated circuit device as claimed in claim 1, wherein the first resistance unit and the second resistance unit are formed by commonly connecting, in parallel, gates of plural PMOS transistor circuits and NMOS transistor circuits that are connected in series.

5. An output circuit of a semiconductor integrated circuit device comprising:

a first CMOS inverter circuit including a PMOS transistor (P2) and an NMOS transistor (N2) connected in series via a first variable resistance unit having a control electrode between a first power-supply potential and a second power-supply potential;

a second CMOS inverter circuit including a PMOS transistor (P3) and an NMOS transistor (N3) connected in series via a second variable resistance unit having a control electrode between the first power-supply potential and the second power-supply potential;

a third CMOS inverter circuit including a PMOS transistor (P8) and an NMOS transistor (N8) connected in series via a node n5 between the first power-supply potential and the second power-supply potential;

a fourth CMOS inverter circuit including a PMOS transistor (P9) and an NMOS transistor (N9) connected in series via a node n6 between the first power-supply potential and the second power-supply potential, the node n6 being connected to the control electrodes of the first and second variable resistance units, the input being connected to the node n5; and a CMOS circuit including a PMOS transistor (P1) and an NMOS transistor (N1) connected in series via a node n4 between the first power-supply potential and the second power-supply potential, the PMOS transistor (P1) having a gate connected to a drain of the PMOS transistor (P2), the NMOS transistor (N1) having a gate connected to a drain of the NMOS transistor (N3), the node n4 being connected to an input of the third CMOS inverter circuit.

6. The output circuit of the semiconductor integrated circuit device as claimed in claim 5, wherein the first variable resistance unit and the second variable resistance unit are transfer gates formed by commonly connecting, in parallel, gates of plural PMOS transistor circuits and NMOS transistor circuits that are connected in series, and the control electrodes are the gates.

7. An output circuit of a semiconductor integrated circuit device comprising:

a first CMOS inverter circuit including a PMOS transistor (P2) and an NMOS transistor (N2) connected in series via a first variable resistance unit having a control electrode between a first power-supply potential and a second power-supply potential;

a second CMOS inverter circuit including a PMOS transistor (P3) and an NMOS transistor (N3) connected in series via a second variable resistance unit having a control electrode between the first power-supply potential and the second power-supply potential;

a third CMOS inverter circuit including a PMOS transistor (P8) and an NMOS transistor (N8) connected in series via a node n5 between the first power-supply potential and the second power-supply potential;

a fourth CMOS inverter circuit including a PMOS transistor (P9) and an NMOS transistor (N9) connected in series via a node n6 between the first power-supply potential and the second power-supply potential, the node n6 being connected to the control electrodes of the first and second variable resistance units, the input being connected to the node n5;

a first CMOS circuit including a PMOS transistor (P5) and an NMOS transistor (N5) connected in series via a node n4 between the first power-supply potential and the second power supply potential, the PMOS transistor (P5) having a gate connected to a drain (node n2) of the PMOS transistor (P2), the NMOS transistor (N5) having a gate connected to a drain (node n3) of the NMOS transistor (N3), the node n4 being connected to an input of the third CMOS inverter circuit;

a second CMOS circuit including a PMOS transistor (P1) and an NMOS transistor (N1) connected in series via the node n4 between the first power-supply potential and the second power-supply potential;

a first resistance unit connected between a gate of the PMOS transistor (P1) and the node n2;

a second resistance unit connected between a gate of the NMOS transistor (N1) and the node n3;

a PMOS transistor (P7) having a source connected to the first power-supply potential, a gate connected to the node n2, and a drain connected to the gate of the PMOS transistor (P1); and an NMOS transistor (N7) having a source connected to the second power-supply potential, a gate connected to the node n3, and a drain connected to the gate of the NMOS transistor (N1).

8. The output circuit of the semiconductor integrated circuit device as claimed in claim 7, wherein the first variable resistance unit and the second variable resistance unit are transfer gates formed by commonly connecting, in parallel, gates of plural PMOS transistor circuits and NMOS transistor circuits that are connected in series, and the control electrodes are the gates.

9. The output circuit of the semiconductor integrated circuit device as claimed in claim 7, wherein the first resistance unit is formed by an NMOS transistor having a gate connected to the first power-supply potential, a drain connected to the gate of the PMOS transistor (P1), and a source connected to the node n2, and the second resistance unit is formed by a PMOS transistor having a gate connected to the second power-supply potential, a drain connected to the gate of the NMOS transistor (N1), and a source connected to the node n3.

10. The output circuit of the semiconductor integrated circuit device as claimed in claim 7, wherein the first resistance unit and the second resistance unit are formed by commonly connecting, in parallel, gates of plural PMOS transistor circuits and NMOS transistor circuits that are connected in series.

11. An output circuit of a semiconductor integrated circuit device comprising:

a first CMOS inverter circuit including a PMOS transistor (P2) and an NMOS transistor (N2) connected in series via a first variable resistance unit having a control electrode between a first power-supply potential and a second power-supply potential;

a second CMOS inverter circuit including a PMOS transistor (P3) and an NMOS transistor (N3) connected in series via a second variable resistance unit having a control electrode between the first power-supply potential and the second power-supply potential;

a first CMOS circuit including a PMOS transistor (P4) and an NMOS transistor (N4) connected in series via a node n1 between the first power-supply potential and the second power supply potential, the node n1 being connected to the control electrodes of the first and second variable resistance units, the PMOS transistor (P4) having a gate connected to a drain (node n2) of the PMOS transistor (P2), the NMOS transistor (N4) having a gate connected to a drain (node n3) of the NMOS transistor (N3);

a second CMOS circuit including a PMOS transistor (P15) and an NMOS transistor (N15) connected in series via a node n7 between the first power-supply potential and the second power-supply potential, the PMOS transistor (P15) having a gate connected to the node n2, the NMOS transistor (N15) having a gate connected to the node n3;

a third CMOS circuit including a PMOS transistor (P1) and an NMOS transistor (N1) connected in series between the first power-supply potential and the second power-supply potential;

an NMOS transistor (N16) having a drain and a source connected between a gate of the PMOS transistor (P1) and the node n2, and having a gate connected to the node n7;

a PMOS transistor (P16) having a drain and a source connected between a gate of the NMOS transistor (N1) and the node n3, and having a gate connected to the node n7;

a PMOS transistor (P7) having a source connected to the first power-supply potential, a gate connected to the node n2, and a drain connected to the gate of the PMOS transistor (P1); and an NMOS transistor (N7) having a source connected to the second power-supply potential, a gate connected to the node n3, and a drain connected to the gate of the NMOS transistor (N1).

12. The output circuit of the semiconductor integrated circuit device as claimed in claim 11, wherein the first variable resistance unit and the second variable resistance unit are transfer gates formed by commonly connecting, in parallel, gates of plural PMOS transistor circuits and NMOS transistor circuits that are connected in series, and the control electrodes are the gates.

13. The output circuit of the semiconductor integrated circuit device as claimed in claim 11, wherein the PMOS transistor (P16) and the NMOS transistor (N16) are formed by commonly connecting, in parallel, gates of plural PMOS transistor circuits and NMOS transistor circuits that are connected in series.

* * * * *